July 14, 1964 S. R. RICH 3,141,140
A.C. OPERATED TRANSISTOR OSCILLATOR OR AMPLIFIER CIRCUITS
Filed May 20, 1959 3 Sheets-Sheet 1

INVENTOR.
STANLEY R. RICH
BY Alfred H. Rosen
ATTORNEY

A.C. OPERATED TRANSISTOR OSCILLATOR OR AMPLIFIER CIRCUITS

Filed May 20, 1959 3 Sheets-Sheet 2

INVENTOR.
STANLEY R. RICH
BY Alfred H. Rosen
ATTORNEY

July 14, 1964 S. R. RICH 3,141,140

A.C. OPERATED TRANSISTOR OSCILLATOR OR AMPLIFIER CIRCUITS

Filed May 20, 1959 3 Sheets-Sheet 3

INVENTOR.
STANLEY R. RICH
BY Alfred H. Rosen
ATTORNEY

United States Patent Office 3,141,140
Patented July 14, 1964

3,141,140

A.C. OPERATED TRANSISTOR OSCILLATOR OR AMPLIFIER CIRCUITS

Stanley R. Rich, West Hartford, Conn., assignor, by mesne assignments, to Acoustica Associates, Inc., Beverly Hills, Calif., a corporation of New York Filed May 20, 1959, Ser. No. 814,416
14 Claims. (Cl. 331—71)

This invention relates to transistor circuits and more particularly to circuits capable of generating oscillations and/or amplifying oscillating signals over a wide range of frequencies with a high degree of frequency stability with reference to supply voltage, and to methods and means for driving transistor circuits directly from an alternating current voltage supply.

Conventional transistor oscillator circuits of the grounded base and grounded emitter types are known. Each of these known circuits is characterized by an advantage in one characteristic accompanied by a disadvantage in another. Thus, the grounded base oscillator circuit has a superior high frequency capability but relatively poor starting characteristics, whereas the grounded emitter type of oscillator circuit has poor high frequency capability but better starting characteristics. It is an object of the present invention to provide a transistor oscillator circuit which has improved high frequency capabilities accompanied by good starting characteristics, both equivalent to or better than the existing superior characteristics of both of these conventional circuits. It is another object to provide such an improved circuit which is capable of amplifying as well as oscillating throughout a high range of frequencies, with superior starting characteristics in all cases.

Conventional circuits known up to now in the prior art have uniformly required that a source of unidirectional voltage be separately made available, that is, a separate D.C. supply is required for their operation. It is an object of the present invention to provide circuit means which will operate transistor oscillators and amplifiers directly from an alternating current supply, thereby eliminating the need for a separate D.C. voltage supply.

According to the present invention a transistor circuit is provided in which operating signals are supplied to both the base and the emitter electrodes of a transistor, in relatively opposite phase, but otherwise of substantially equal content. An output circuit is connected to the collector electrode of the transistor. In the case of use of this circuit as an amplifier the input circuit is coupled to the emitter and the base electrodes through the phase-opposition supply means. In the case of an oscillator circuit the phase-opposition supply means are coupled to a tuned output circuit so that positive feedback is supplied from the output circuit to each of the base and emitter electrodes, in relative phase opposition. Operating potentials are provided to the circuit by means of a voltage divider connected directly across a source of alternating current, through a pair of terminals which are a part of the circuit. The voltage divider which provides correct operating potentials to all three electrodes of the transistor, includes as one element a diode or unidirectional conductor, which is so poled that when the alternating current is in that direction which provides correct relative operating potentials for the transistor the diode is conductive and acts as a resistance element in the voltage divider, whereas on the reverse half-cycle the diode is substantially an open circuit. In the reverse half-cycle the voltage divider operates in a manner to connect the base electrode through a resistor to the collector electrode, so that it prevents all but leakage current from flowing through the transistor, thereby preventing destruction of the transistor due to operation in the reverse direction.

These and other features and objects of the invention will become more apparent from the description of certain embodiments thereof which follows. This description refers to the accompanying drawings, wherein.

Figure 1:
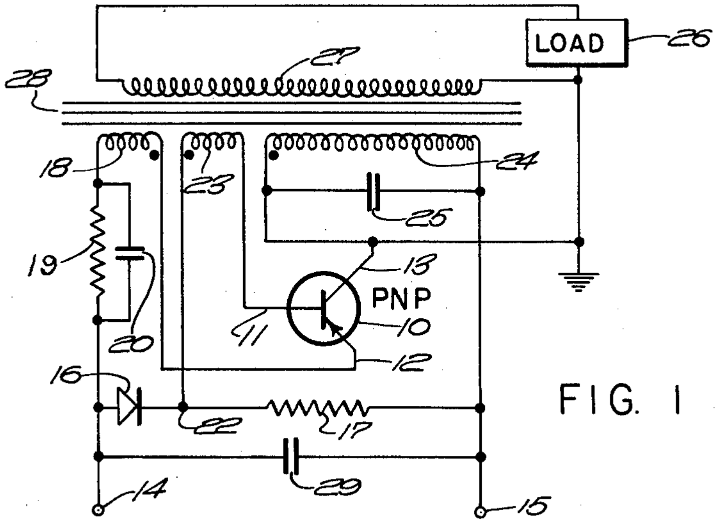
FIG. 1 illustrates an oscillator circuit according to the invention.

Referring now to FIG. 1, a type PNP transistor 10 is shown having a base electrode 11, an emitter electrode 12 and a collector electrode 13. A pair of terminals 14 and 15 are provided, adapted for connecting the circuit to a source of alternating current (not shown). Connected across the terminals 14, 15 is a voltage divider comprised of a diode rectifier 16 and a resistor 17. The emitter electrode 12 is connected to one terminal 14 through a first feedback winding 18, the purpose of which will be presently described, and a resistor 19 in series; a capacitor 20 is connected in parallel with this resistor. The base electrode 11 is connected to the junction 22 of the diode rectifier 16 and resistor 17, via a second feedback winding 23, the purpose of which will also presently be described. The collector electrode 13 is connected through a third winding 24 to the remaining terminal 15. A capacitor 25 is connected in shunt with the third winding 24. The third winding 24 is the primary winding of a transformer 28, and with the capacitor 25 it comprises a tuned circuit adapted for oscillation at a desired frequency. The feedback windings 18 and 23 are coupled to this tuned circuit. A load 26 is connected across the secondary winding 27 of the transformer 28. A capacitor 29 is connected across the terminals 14 and 15 for the purpose of providing a shunt to the oscillating frequency across the voltage divider comprised of the rectifier 16 and resistor 17. The operation of the circuit shown in FIG. 1 is explained with reference to FIGS. 2 and 3.

Figures 2, 3:
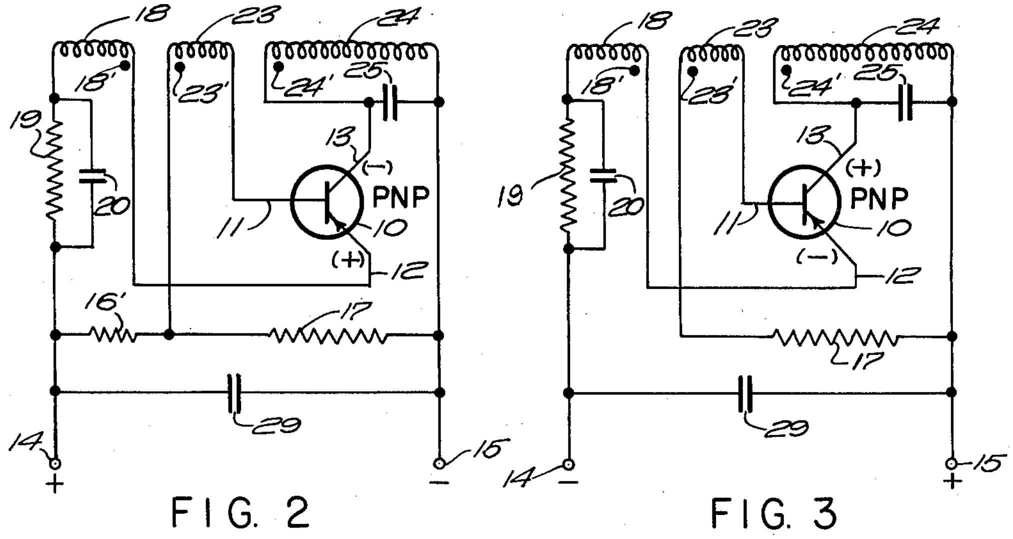
FIGS. 2 and 3 illustrate the operation of FIG. 1, using a type PNP transistor.

FIG. 2 illustrates the condition in which an applied alternating voltage is positive at terminal 14 and negative at terminal 15. In this condition the rectifier 16, poled to be in the forward direction from terminal 14 to terminal 15 as shown in FIG. 1, is conductive and comprises in effect a resistance element 16'. This resistance element is so chosen with respect to the resistor 17, that proper operating potentials are present on the base, emitter and collector electrodes of the transistor 10. Specifically, the collector electrode 13 is negative with respect to the base 11, while the emitter electrode 12 is somewhat positive with respect to the base 11. In this condition the transistor oscillator circuit can oscillate at a frequency determined by the tuned circuit 24, 25 which may, for example, be 40 kilocycles per second. Signals of this frequency are coupled into the feedback windings 23 and 18. The second feedback winding 23 is phased to drive the base electrode 11 in the same phase as the collector electrode 13, as indicated by the dots 23' and 24', thereby to cause oscillations to build up. The first feedback winding 18 is phased to drive the emitter electrode 12 in the opposite phase to the collector electrode 13, as indicated by the dot 18', thereby also causing oscillations to build up. The resistor 19 and capacitor 20 in parallel are the usual "cathode" bias elements. The by-pass capacitor 29 is, as mentioned above, substantially a short circuit at the oscillator frequency (e.g., 40 kilocycles per second).

FIG. 3 illustrates the conditions existing on the reverse half-cycle, when terminal 14 is negative with respect to terminal 15. Under this condition the collector electrode 13 would be expected to be positive with respect to the base electrode 11 and the emitter electrode 12 would be expected to be negative with respect to the base electrode 11, and the transistor would appear to be operating in the reverse direction, using its normal collector 13 as an emitter and its normal emitter 12 as a collector, which is known to be destructive. However, in this condition the rectifier 16 is substantially nonconductive so that as a practical matter, the voltage divider no longer exists, and its permanent resistor 17 connects the base electrode 11 directly to the "emitter" electrode (13 in the reverse direction). By thus clamping the base electrode 11 to the same potential as the "emitter" electrode (13 in the reverse direction) this circuit assures that no current is introduced into the "emitter" electrode, with the result that no current, except a small leakage current, will flow in the "collector" circuit (12 in the reverse direction), and prevents damage to the transistor during the reverse half-cycle. It is thereby possible with the present circuit to operate the oscillator circuit of FIG. 1 directly from alternating current, applying suitable operating potentials to the transistor 10 during one half-cycle of the alternating current, and clamping the base electrode to the same potential as the "emitter" electrode during the reverse half-cycle, thereby preventing the flow of any but a small leakage current in the "collector" circuit and hence preventing destruction of the transistor during the reverse half-cycle of the alternating current.

Figure 4:
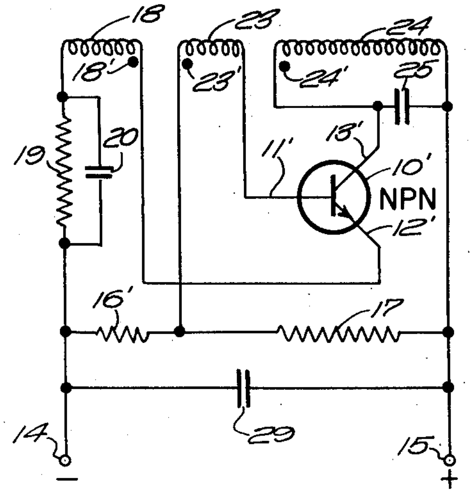
FIGS. 4 and 5 illustrate the operation of FIG. 1 using a type NPN transistor.
Figure 5:
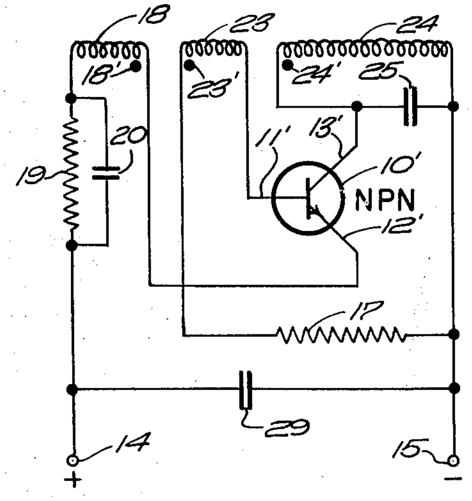

FIGS. 4 and 5 illustrate the arrangement of the circuit when a type NPN transistor 10′ is used in place of the type NPN transistor 10 of FIG. 1. In this arrangement, the diode 16 (not shown) is poled in the reverse direction (relative to FIG. 1), so that when terminal 14 is negative with respect to terminal 15 (FIG. 4) the diode is conductive (i.e., in the forward direction from terminal 15 to terminal 14) and constitutes in effect the resistor 16′. The voltage divider comprising the resistor 16′ and the resistor 17 then applies suitable potentials to the type NPN transistor, namely, those in which the collector electrode 13′ is positive with respect to the base electrode 11′ and the emitter electrode 12′ is negative with respect to the base electrode 11′. The remaining elements of the circuit are identical to those of FIG. 1 and bear like reference characters; they will not be described.

FIG. 5 illustrates the situation that exists when terminal 14 is positive with respect to terminal 15. In this condition the resistor 16′ is absent, due to the fact that the diode 16 is substantially an open circuit, and the permanent resistor 17 clamps the base electrode 11′ to the "emitter" electrode 13′ thereby, like the circuit shown in FIG. 3, protecting the transistor 10′ by constraining it to pass only a small leakage current.

Typical values of circuit elements employed in a circuit according to FIG. 1 which has been constructed are as follows:

| | |
|---|---|
| Resistor 19 | 4 ohms, 5 watt. |
| Capacitor 20 | 50 mfd., 50 volt. |
| Resistor 17 | 100 ohms, 5 watt. |
| Capacitor 29 | 50 mfd., 5 volt. |

Employing a Delco type 2 N–174 (PNP) transistor, and a Sarkes-Tarzian type M–150 silicon rectifier poled as shown in FIG. 1, with 24 volt, 60 cycle per second alternating current applied across the terminals 14 and 15, leakage current through the transistor during the reverse half cycle (as shown in FIG. 3) was only two (2) milliamperes, which is practically an open circuit compared with the current—three to five amperes—drawn by the transistor during the forward half cycle (as shown in FIG. 2). A Sarkes-Tarzian type M–500 silicon rectifier was also used, with similar results.

In the foregoing circuit, double feedback was accomplished with turns ratios of fourteen (14) turns on the oscillator coil 24 for each three (3) turns on each of the feedback coils 18 and 23. With the oscillator circuit tuned to 40 kilocycles per second, this circuit generated up to twenty (20) watts at that frequency. The double feedback oscillator circuit exhibited nearly constant frequency with respect to power supply voltage. Measured with the oscillator circuit tuned to 32,000 kilocycles per second, for example, the variation in frequency was found to be approximately ten (10) cycles per second over a collector voltage range from five (5) to twenty (20) volts when operating into a resistive load.

Figure 6:
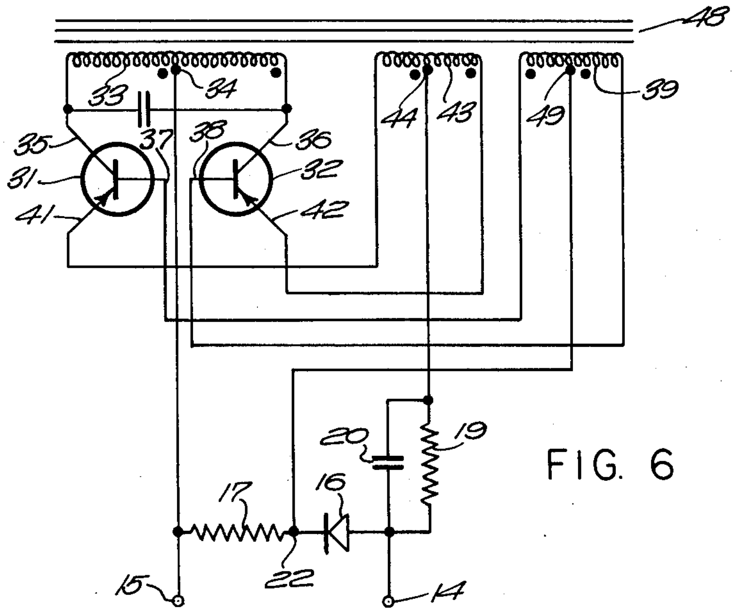
FIG. 6 illustrates an oscillator according to FIG. 1 employing two transistors in push-pull relation with respect to the oscillation frequency.

Referring now to FIG. 6, two transistors type PNP, 31 and 32 are shown connected in a circuit which has all the features of FIG. 1. The output oscillating circuit includes an output winding 33 which is center tapped at 34 and connected at its ends to the collector electrodes 35 and 36 of the transistors 31 and 32, respectively. The center tap 34 is connected to one power input terminal 15. The base electrodes 37 and 38 of the transistors 31 and 32, respectively, are connected to respective ends of a first feedback winding 39 which is center tapped at 49 and connected via the center tap to the junction point 22 of the diode 16 and resistor 17 connected across the terminals 14 and 15. The emitter electrodes 41 and 42 of the diodes 31 and 32, respectively, are connected to respective ends of a second feedback winding 43 which is connected at its center tap 44 to the terminal 14 through the bias resistor 19 and capacitor 20. As will be appreciated, elements which are common with those of FIG. 1 bear the same reference characters. The transformer 48 omits an output winding, and load, since these may be the same as in FIG. 1. It will be appreciated that the two transistors are both operated from an alternating current source in the same manner as the single transistor of FIG. 1, but that they operate in push-pull with reference to the oscillating frequency. They are otherwise the same as in FIG. 1.

Figure 7:
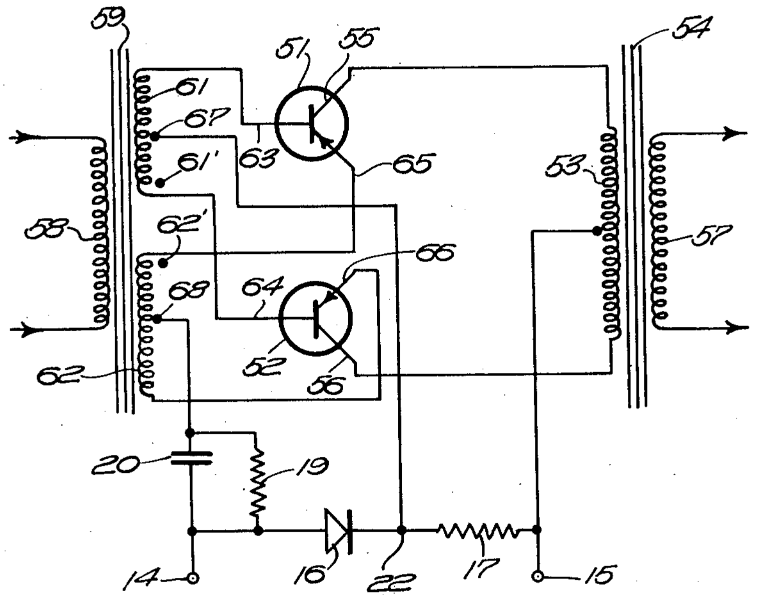
FIG. 7 illustrates an amplifier circuit according to the invention employing two transistors to provide a push-pull amplifier.

Referring now to FIG. 7, two transistors 51 and 52 of the PNP type are shown in an amplifier circuit according to the invention. The output circuit comprising the primary winding 53 of an output transformer 54 is connected at the ends of the primary winding to the collector electrodes 55 and 56 of the transistors 51 and 52, respectively. A secondary winding 57 is provided on the output transformer 54. The terminals 14 and 15, as in FIG. 1, are shunted by a voltage divider comprising the diode 16 and resistor 17. An input winding 58 of an input transformer 59 provides signals to the base electrodes and emitter electrodes via first and second signal input windings 61 and 62, respectively. The first winding 61 is connected at its ends to the base electrodes 63 and 64 of the transistors 51 and 52, respectively. The second input winding 62 is connected at its ends to the emitter electrodes 65 and 66 of the two transistors 51 and 52, respectively. The center tap 67 of the first input winding 61 is connected to the junction 22 of the diode 16 and resistor 17. The center tap 68 of the second input winding is connected to terminal 14 via the bias resistor 19 and bias resistor shunt capacitor 20. Elements having the same purpose as in FIG. 1 bear the same reference characters.

An input signal applied to the input winding 58 is fed in phase opposition to the base electrode 63 and emitter electrode 65 of the first transistor 51 via one-half of the first input winding 61 and one-half of the second input winding 62 which are connected to apply their signals in phase opposition, as indicated by the dots 61′ and 62′. The remaining half of each winding likewise provides input signals in phase opposition to the emitter electrode 66 and base electrode 64 of the second transistor 52. In addition, the two transistors are driven out of phase relative to each other, so that push-pull operation results in the primary winding 53 of the output transformer 54. FIG. 7 therefore illustrates a push-pull amplifier circuit which is operated with two transistors which are powered directly from an A.C. source. Again, as explained above in connection with FIG. 1 the transistors will be operated on one half-cycle of the A.C. source, when the terminal 14 is positive with respect to terminal 15, and will be inoperative but clamped so that they pass only safe leakage current during the reverse half-cycle. If the transistors are changed to type NPN, the diode 16 need only be reversed in polarity to render the circuit operative from an A.C. source, as is indicated above with reference to FIGS. 4 and 5.

The embodiments of the invention which have been illustrated and described herein are but a few illustrations of the invention. Other embodiments and modifications will occur to those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention, and it is intended that this invention includes all modifications and equivalents which fall within the scope of the appended claims.

What is claimed is:

1. Transistor circuit adapted to be energized by alternating current comprising a transistor having base, emitter and collector electrodes, a pair of energizing current input terminals, potential divider means connected directly across said terminals to provide operating potentials for said electrodes, said potential divider means including rectifier means and resistor means in series with said rectifier means poled to constitute said potential divider means a voltage divider providing said potentials during the half-cycle of applied energizing alternating current which biases said transistor for normal operating and effectively to open-circuit whereby the remainder of said potential divider means serves to clamp said base electrode to the same potential as said collector electrode during the reverse half-cycle, said base electrode being connected to the junction of said rectifier means and said resistor means, said collector electrode being connected to said resistor means, and said emitter electrode being connected to the remaining side of said rectifier means.

2. Transistor circuit adapted to be energized by alternating current comprising a transistor having base, emitter and collector electrodes, first and second energizing current input terminals, a resistor connected at one side to said first terminal and a substantially unidirectional conductor connected at one side to said second terminal joined together at their remaining sides in series between said terminals, a connection from said first terminal to said collector electrode in parallel with said one side of said resistor, said base electrode being connected to the junction of said unidirectional conductor and resistor, and said emitter electrode being connected to said second terminal in parallel with said one side of said unidirectional conductor, said unidirectional conductor being poled in the conductive direction for the polarity of applied alternating current which will bias said transistor for normal operation, whereby said unidirectional conductor is substantially nonconductive for the reverse polarity of applied alternating current and said resistor is adapted during such reverse polarity to clamp said collector electrode to substantially the same potential as said base electrode.

3. Transistor circuit adapted to be energized by alternating current comprising a PNP-type transistor having base, emitter and collector electrodes, first and second energizing current input terminals, a resistor connected at one side to said first terminal and a rectifier connected at one side to said second terminal joined together at their remaining sides in series between said terminals, a connection from said first terminal to said collector electrode in parallel with said one side of said resistor, said base electrode being connected to the junction of said rectifier and resistor, and said emitter electrode being connected to said second terminal in parallel with said one side of said rectifier, said rectifier being poled in the forward direction to energizing current which renders said collector electrode negative relative to said emitter electrode.

4. Transistor circuit adapted to be energized by alternating current comprising an NPN-type transistor having base, emitter and collector electrodes, first and second energizing current input terminals, a resistor connected at one side to said first terminal and a rectifier connected at one side to said second terminal joined together at their remaining sides in series between said terminals, a connection from said first terminal to said collector electrode in parallel with said one side of said resistor, said base electrode being connected to the junction of said rectifier and resistor, and said emitter electrode being connected to said second terminal in parallel with said one side of said rectifier, said rectifier being poled in the forward direction to energizing current which renders said collector electrode positive relative to said emitter electrode.

5. Transistor circuit for oscillating signals adapted to be energized by alternating current comprising a transistor having base, emitter and collector electrodes, a pair of energizing current input terminals, potential divider means connected directly across said terminals to provide operating potentials for said electrodes, said potential divider means including rectifier means and resistor means in series with said rectifier means poled to constitute said potential divider means a voltage divider providing said potentials during the half-cycle of applied energizing alternating current which biases said transistor for normal operation and effectively to open-circuit whereby the remainder of said potential divider means serves to clamp said base electrode to the same potential as said collector electrode during the reverse half-cycle, said base electrode being connected to the junction of said rectifier means and said resistor means, said collector electrode being connected to said resistor means, and said emitter electrode being connected to the remaining side of said rectifier means, means to apply signals of like content but opposite phase simultaneously between said base electrode and said potential divider means and between said emitter electrode and said potential divider means, respectively, and a load circuit connected between said collector electrode and said potential divider means.

6. Transistor circuit for oscillating signals adapted to be energized by alternating current comprising a transistor having base, emitter and collector electrodes, first and second energizing current input terminals, a resistor connected at one side to said first terminal and a substantially unidirectional conductor connected at one side to said second terminal joined together at their remaining sides in series between said terminals, means to apply signals of like content but opposite phase simultaneously between said base electrode and the junction of said unidirectional conductor and resistor and between said emitter electrode and said second terminal, respectively, and a load circuit connected between said collector electrode and said first terminal, said unidirectional conductor being poled in the conductive direction for the polarity of applied alternating current which will bias said transistor for normal operation, whereby said unidirectional conductor is substantially nonconductive for the reverse polarity of applied alternating current and said resistor is adapted during such reverse polarity to clamp said collector electrode to substantially the same potential as said base electrode.

7. Transistor amplifier for oscillating signals adapted to be energized by alternating current comprising a transistor having base, emitter and collector electrodes, a pair of energizing current input terminals, potential divider means connected across said terminals to provide operating potentials for said electrodes, said electrodes being connected thereto, said potential divider means including rectifier means and resistor means in series with said rectifier means poled to constitute said potential divider means a voltage divider providing said potentials during the half-cycle of applied energizing alternating current which biases said transistor for normal operation and effectively to open-circuit whereby the remainder of said potential divider means serves to clamp said base electrode to the same potential as said collector electrode during the reverse half-cycle, a signal input circuit, means coupled to said signal input circuit to apply input signals of opposite phase simultaneously between said base electrode and said potential divider means and between said emitter electrode and said potential divider means, respectively, and a signal output circuit connected between said collector electrode and said potential divider means.

8. Transistor amplifier circuit for oscillating signals adapted to be energized by alternating current comprising a transistor having base, emitter and collector electrodes, first and second energizing current input terminals, a resistor connected at one side to said first terminal and a substantially unidirectional conductor connected at one side to said second terminal joined together at their remaining sides in series between said terminals, a signal input circuit, means coupled to said signal input circuit to apply input signals of opposite phase simultaneously between said base electrode and the junction of said unidirectional conductor and resistor and between said emitter electrode and said second terminal, respectively, and a signal output circuit connected between said collector electrode and said first terminal, said unidirectional conductor being poled in the conductive direction for the polarity of applied alternating current which will bias said transistor for normal operation, whereby said unidirectional conductor is substantially nonconductive for the reverse polarity of applied alternating current and said resistor is adapted during such reverse polarity to clamp said collector electrode to substantially the same potential as said base electrode.

9. Transistor push-pull amplifier circuit for oscillating signals adapted to be energized by alternating current comprising first and second transistors having first and second base, emitter and collector electrodes, respectively, a pair of energizing current input terminals, potential divider means connected across said terminals to provide operating potential for each of said transistors, said electrodes being connected thereto, said potential divider means including rectifier means and resistor means in series with said rectifier means poled to constitute said potential divider means a voltage divider providing said potentials during the half-cycle of applied energizing alternating current which biases each of said transistors for normal operation and effectively to open-circuit whereby the remainder of said potential divider means serves to clamp the base electrode thereof to the same potential as the collector electrode thereof during the reverse half-cycle, a signal input circuit, means coupled to said signal input circuit to apply first signals of relatively opposite phase simultaneously between said first base electrode and said potential divider means and between said first emitter electrode and said potential divider means, respectively, and second signals of relatively opposite phase simultaneously between said second base electrode and said potential divider means and between said second emitter electrode and said potential divider means, respectively, said coupling means being relatively phased to provide that during operation said first signals will be in phase opposition with said second signals applied to corresponding electrodes of said first and second transistors, a signal output circuit connected between said first and second collector electrodes, and a connection between said source and an intermediate point on said signal output circuit.

10. Transistor push-pull amplifier circuit for oscillating signals adapted to be energized by alternating current comprising first and second transistors having first and second base, emitter and collector electrodes, respectively, first and second energizing current input terminals, a resistor connected at one side to said first terminal and a substantially undirectional conductor connected at one side to said second terminal joined together at their remaining sides in series between said terminals, a signal input circuit, first signal means coupled to said signal input circuit to apply first signals of relatively opposite phase between the junction of said unidirectional conductor and resistor and said first and second base electrodes, respectively, and second signal means coupled to said signal input circuit to apply second signals of relatively opposite phase between said second terminal and said first and second emitter electrodes, respectively, said first and second signal means being relatively phased to provide that the first and second signals at the base and collector electrodes of each transistor will be in relative phase opposition during operation, a signal output circuit connected between said first and second collector electrodes, and a connection between said first terminal and an intermediate point on said signal output circuit, said unidirectional conductor being poled in the conductive direction for the polarity of applied alternating current which will bias said transistor for normal operation, whereby said unidirectional conductor is substantially nonconductive for the reverse polarity of applied alternating current and said resistor is adapted during such reverse polarity to clamp said collector electrode to substantially the same potential as said base electrode.

11. Transistor oscillator circuit adapted to be energized by alternating current comprising a transistor having base, emitter and collector electrodes, a pair of energizing current input terminals, potential divider means connected across said terminals to provide operating potentials for said electrodes, said electrodes being connected thereto, said potential divider means including rectifier means and resistor means in series with said rectifier means poled to constitute said potential divider means a voltage divider providing said potentials during the half-cycle of applied energizing alternating current which biases said transistor for normal operation and effectively to open-circuit whereby the remainder of said potential divider means serves to clamp said base electrode to the same potential as said collector electrode during the reverse half-cycle, a tuned load circuit connected between said collector electrode and said potential divider means, and means coupled to said load circuit to apply positive feedback signals of opposite phase simultaneously between said base electrode and said potential divider means and between said emitter electrode and said potential divider means, respectively.

12. Transistor oscillator circuit adapted to be energized by alternating current comprising a transistor having base, emitter and collector electrodes, first and second energizing current input terminals, a resistor connected at one side to said first terminal and a substantially unidirectional conductor connected at one side to said second terminal joined together at their remaining sides in series between said terminals, a tuned load circuit connected between said collector electrode and said first terminal, and means coupled to said load circuit to apply positive feedback signals of opposite phase simultaneously between said base electrode and the junction of said unidirectional conductor and resistor and between said emitter electrode and said second terminal, respectively, said unidirectional conductor being poled in the conductive direction for the polarity of applied alternating current which will bias said transistor for normal operation, whereby said unidirectional conductor is substantially nonconductive for the reverse polarity of applied alternating current and said resistor is adapted during such reverse polarity to clamp said collector electrode to substantially the same potential as said base electrode.

13. Transistor oscillator circuit adapted to be energized by alternating current comprising first and second transistors having first and second base, emitter and collector electrodes, respectively, a pair of energizing current input terminals, potential divider means connected across said terminals to provide operating potentials for said electrodes, said electrodes being connected thereto, said potential divider means including rectifier means and resistor means in series with said rectifier means poled to constitute said potential divider means a voltage divider providing said potentials during the half-cycle of applied energizing alternating current which biases each of said transistors for normal operation and effectively to open-circuit whereby the remainder of said potential divider means serves to clamp the base electrode thereof to the same potential as the collector electrode thereof during the reverse half-cycle, a tuned load circuit connected between said collector electrodes, a connection from said potential divider means to an intermediate point of said load circuit, first feedback means coupled to said load circuit to apply first positive feedback signals of relatively opposite phase simultaneously between said first base electrode and said potential divider means and between said first emitter electrode and said potential divider means, respectively, and second feedback means coupled to said load circuit to apply second positive feedback signals of relatively opposite phase simultaneously between said second base electrode and said potential divider means and between said second emitter electrode and said potential divider means, respectively, said first and second feedback means being relatively phased to provide that during operation said first feedback signals will be in phase opposition with said second feedback signals applied to corresponding electrodes of said first and second transistors.

14. Transistor oscillator circuit adapted to be energized by alternating current comprising first and second transistors having first and second base, emitter and collector electrodes, respectively, first and second energizing current input terminals, a resistor connected at one side to said first terminal and a substantially unidirectional conductor connected at one side to said second terminal joined together at their remaining sides in series between said terminals, a tuned load circuit connected between said collector electrodes, a connection from said first terminal to an intermediate point of said load circuit, first feedback means coupled to said load circuit to apply first feedback signals of relatively opposite phase between the junction of said unidirectional conductor and resistor and said first and second base electrodes, respectively, and second feedback means coupled to said load circuit to apply second feedback signals of relatively opposite phase between said second terminal and said first and second emitter electrodes, respectively, said first and second feedback means being relatively phased to provide that the first and second feedback signals at the base and collector of each transistor will be in relative phase opposition during operation, said unidirectional conductor being poled in the conductive direction for the polarity of applied alternating current which will bias said transistor for normal operation, whereby said unidirectional conductor is substantially nonconductive for the reverse polarity of applied alternating current and said resistor is adapted during such reverse polarity to clamp said collector electrode to substantially the same potential as said base electrode.

References Cited in the file of this patent

UNITED STATES PATENTS

| | | |
|---|---|---|
| 2,777,057 | Pankove | Jan. 8, 1957 |
| 2,785,236 | Bright et al. | Mar. 12, 1957 |
| 2,788,493 | Zawels | Apr. 9, 1957 |
| 2,889,460 | Ehret | June 2, 1959 |
| 2,951,995 | Rosier et al. | Sept. 6, 1960 |

OTHER REFERENCES

RCA Technical Note No. 109 (published by RCA, Princeton, N.J.), received March 12, 1958, "Transistor Oscillators Operating From Raw A.C. Power," Ahrons et al.